(12) United States Patent
Wu

(10) Patent No.: US 7,667,390 B2
(45) Date of Patent: Feb. 23, 2010

(54) BOTTOM-EMISSION ORGANIC ELECTROLUMINESCENT DISPLAY OF HIGH RESOLUTION AND POWER SAVING

(75) Inventor: Kuan-Long Wu, Kaohsiung County (TW)

(73) Assignee: AU Optronics Corp., Hsinchu (TW)

( * ) Notice: Subject to any disclaimer, the term of this patent is extended or adjusted under 35 U.S.C. 154(b) by 606 days.

(21) Appl. No.: 11/453,901

(22) Filed: Jun. 16, 2006

(65) Prior Publication Data
US 2007/0132380 A1 Jun. 14, 2007

(30) Foreign Application Priority Data
Dec. 9, 2005 (TW) ............................... 94143650 A

(51) Int. Cl.
*H01J 1/62* (2006.01)
*H01J 63/04* (2006.01)

(52) U.S. Cl. .................... 313/506; 313/500; 313/504; 445/24

(58) Field of Classification Search .......... 313/504–506
See application file for complete search history.

(56) References Cited

U.S. PATENT DOCUMENTS

2004/0012549 A1* 1/2004 Nishikawa ................... 345/76
2004/0263072 A1* 12/2004 Park et al. ................... 313/509
2005/0116632 A1* 6/2005 Funamoto et al. ........... 313/506

FOREIGN PATENT DOCUMENTS

| CN | 1463173 A | 12/2003 |
| CN | 1604706 A | 4/2005 |
| CN | 1668149 A | 9/2005 |

* cited by examiner

*Primary Examiner*—Sikha Roy
(74) *Attorney, Agent, or Firm*—Birch, Stewart, Kolasch & Birch, LLP

(57) ABSTRACT

An organic electroluminescent display comprises a shadow layer, a transparent electrode, a light emitting layer, a reflective electrode and a cap layer formed on a substrate. The transparent electrode is connected to a transistor, located on the shadow layer, and has a larger area than the shadow layer. The cap layer is formed on the upper surface of the transparent electrode, and corresponds to the shadow layer. The light emitting layer is formed on the upper surface of the transparent electrode. And, the reflective electrode is formed on the upper surface of the light emitting layer.

11 Claims, 5 Drawing Sheets

BOTTOM-EMISSION ORGANIC ELECTROLUMINESCENT DISPLAY OF HIGH RESOLUTION AND POWER SAVING

This application claims the benefit of Taiwan Patent Application Serial No. 094143650, filed Dec. 9, 2005, the subject matter of which is incorporated herein by reference.

BACKGROUND OF THE INVENTION (1) Field of the Invention

The present invention relates to an organic electroluminescent display with high resolution.

(2) Description of the Related Art

Each pixel of the typical organic electroluminescent display includes two transistors and one capacitor. The area ratio of the transistors and the capacitor covering the whole pixel can affect the size of the light-emitting region. For example, comparing two displays with the same size, the one with higher resolution has smaller pixel size than the other one. As the pixel size is reduced, the transistors and the capacitor cover more area of the pixel. Whereupon the area used to emit light is getting small in the pixel. When the pixel size is getting small until no perfect region provided for light passing, the light only accesses the gaps between the transistors and the wires.

FIG. 1A is a conventional organic electroluminescent display. Each pixel 110 of the organic electroluminescent display 100 has a switching transistor 111, a driving transistor 112, a capacitor 113 and an organic light emitting diode 114. As the size of the pixel 110 is large enough, the organic light emitting diode 114, transistors 111 and 112, and the capacitor 113 do not overlap with each other, so it has a perfect light-emitting region.

FIG. 1B is another organic electroluminescent display 200 with higher resolution than the organic electroluminescent display 100 shown in FIG. 1A. Each pixel 210 of the organic electroluminescent display 200 includes a switching transistor 211, a driving transistor 212, a capacitor 213 and an organic light emitting diode 214. Unlike FIG. 1A, the organic light emitting diode 214 overlaps with the transistors 211, 212, or the capacitor 213. The physical light-emitting region is only a gap between the transistors 211, 212 and the capacitor 213.

FIG. 1C is a sectional view of the display 200 shown in FIG. 1B. Its fabricating process comprises forming the components such as transistors 211, 212 etc. on the substrate (not numbered); next forming an ITO layer 214a on the forgoing components; and forming a cap layer 215 by a photo mask to define a opening region 216. As shown, the wires, the transistors or the capacitors cover a part of the opening region 210, so the light cannot exit through the part, and the top view of the opening region 216 can refer to FIG. 1D.

To sum up, when the pixel size is getting small until no perfect region provided for light passing, the light only accesses the gap between the transistors and the wires. If the opening region of the cap layer includes some non-light-emitting regions, it may still consume the power, but generate no brightness.

SUMMARY OF THE INVENTION

The object of the present invention is to provide an organic electroluminescent display which can meet the requirements of high resolution and power save.

In one aspect of the present invention, the organic electroluminescent display comprises a shadow layer, a transparent electrode, a light emitting layer, a reflective electrode and a cap layer formed on a substrate. The transparent electrode is connected to a transistor, located on the shadow layer, and has a larger area than the shadow layer. The cap layer is formed on the upper surface of the transparent electrode, and corresponds to the shadow layer. The light emitting layer is formed on the upper surface of the transparent electrode. And, the reflective electrode is formed on the upper surface of the light emitting layer.

The characteristics of the present invention is that, the organic electroluminescent display has a light-emitting region and a non-light-emitting region. The light-emitting region is used to dispose an organic light emitting diode. The non-light-emitting region has a stacking structure including the cap layer, the transparent electrode and the shadow layer.

Preferably, the area of the substrate covered by the cap layer should be smaller than or equal to that covered by the shadow layer. In order to prevent the electric current flowing from the transparent electrode through the cap layer, the cap layer should be made from an insulating material. Accordingly, the power can be save because the electric current cannot flow through the non-light-emitting region covered by the cap layer.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1A:
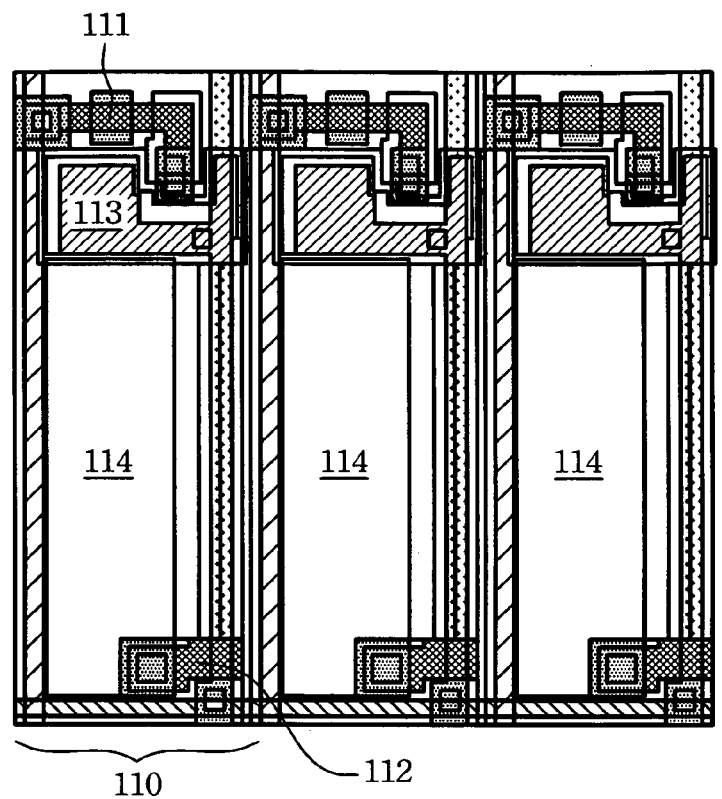
FIG. 1A is an organic electroluminescent display according to the prior art.
Figure 1B:
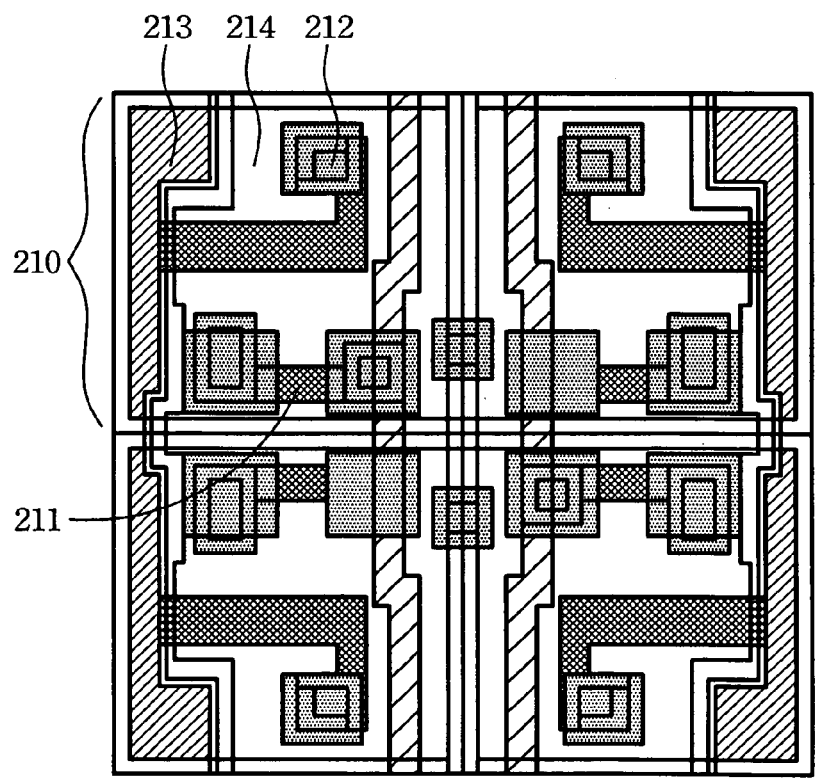
FIG. 1B is another organic electroluminescent display according to the prior art.
Figure 1C:
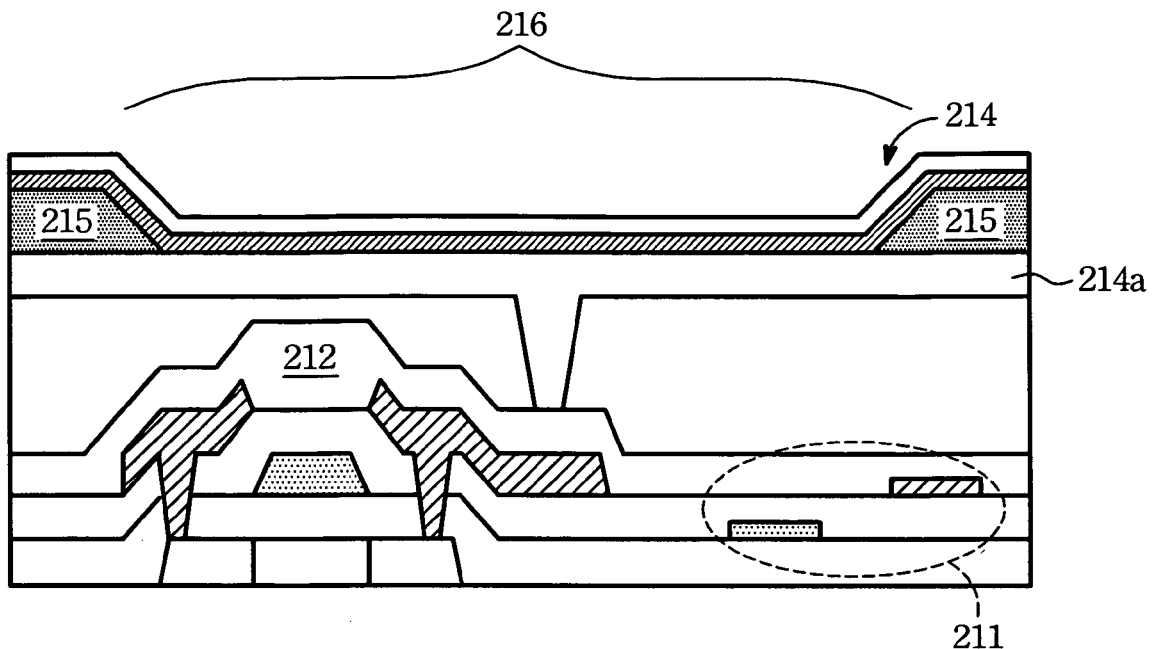
FIG. 1C is a sectional view of the organic electroluminescent display shown in FIG. 1B.
Figure 1D:
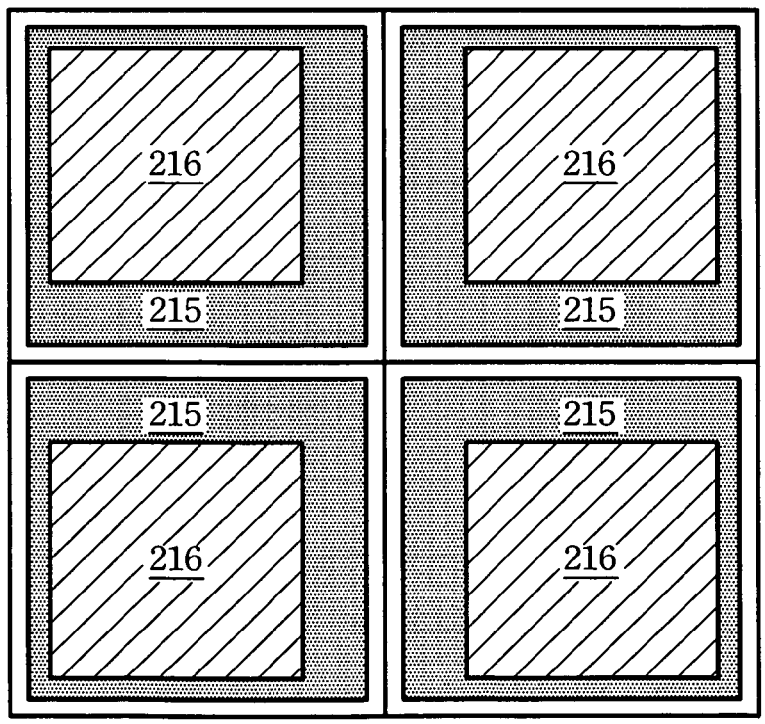
FIG. 1D is a top view of the organic electroluminescent display shown in FIG. 1C.
Figure 2:
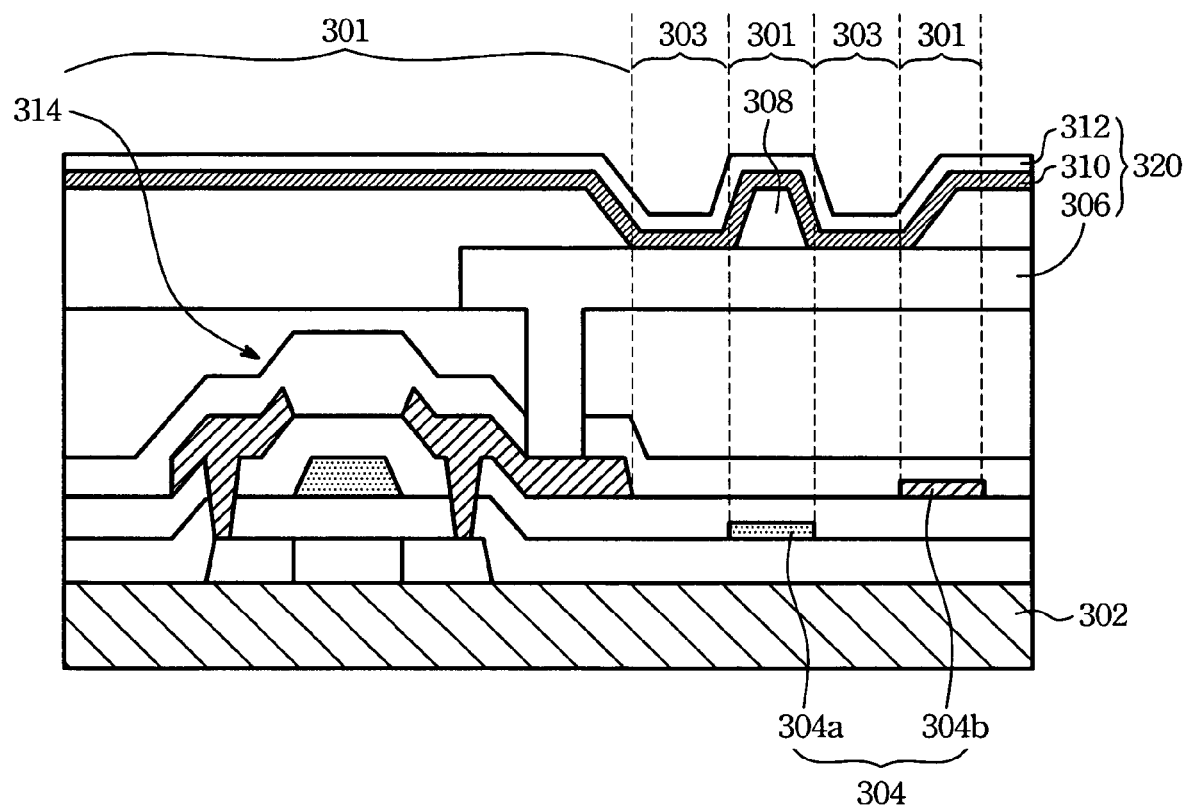
FIG. 2 is a first embodiment according to the present invention.

Refer to FIG. 2, the organic electroluminescent display 300 has a light-emitting region 303 and a non-light-emitting region 301. The light-emitting region 303 is provided to dispose an organic light emitting diode 320. The non-light-emitting region 301 has a cap layer 308, a transparent electrode 306 and a shadow layer 304 formed as stacking structure. The organic light emitting diode 320 includes the transparent electrode 306, a light emitting layer 310 and a reflective electrode 312. If the organic light emitting diode 320 is a bottom emission type, the transparent electrode 306 is formed on the substrate 302 and below the light emitting layer 310, and the reflective electrode 312 is formed on the light emitting layer 310. A transistor 314 is electrically connected to the transparent electrode 306 to drive the organic light emitting diode 320.

In order to reduce the area of each pixel to increase the resolution of the display, a shadow layer 304, such as a metal layer 304a or a metal wire 304b etc., is disposed below the transparent electrode 306. The cap layer 308 is formed on the transparent electrode 306 to define a non-light-emitting region corresponding to the shadow layer 304. In other words, the transparent electrode 306, which is located over the metal layer 304a or the metal wire 304b, is covered by the cap layer 308, so it cannot electrically connect to the light emitting layer 310 and the reflective electrode 312. Therefore, the power can save.

Preferably, the area of the substrate 302 covered by the cap layer 308 should be smaller than or equal to that covered by the shadow layer 304. The cap layer 308 can adopt an insulating material which is patterned by a photo mask to avoid the electric current flowing from the transparent electrode 306 through the cap layer 308.

Figure 3:
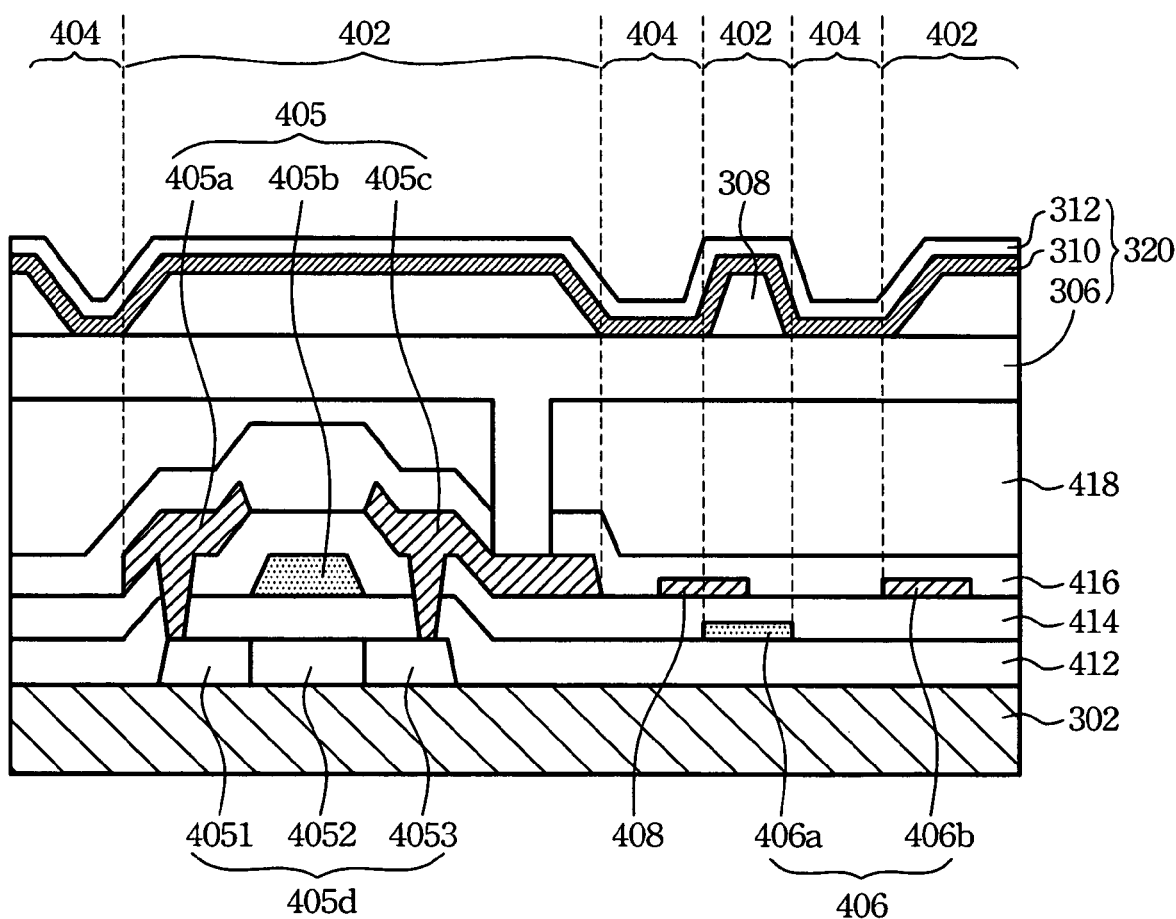
FIG. 3 is a second embodiment according to the present invention.

Refer to FIG. 3, each pixel of the organic electroluminescent display 400 has some wires like a scan line (not shown), a data line (not shown), and some components like a driving transistor 405, a switching transistor 406 and a capacitor 408, which include shadow layers. For higher resolution requirement such as 200 ppi or more, the wires or components are possible to be disposed below the transparent electrode 306, so the present invention can employed to save power.

The fabricating process of the organic electroluminescent display 400 is described as follows. First a semiconductor layer 405d is formed on the substrate 302. The semiconductor layer 405d can be made of amorphous silicon or poly silicon, and has a channel 4052 and two doped areas 4051 and 4053. The doped areas 4051 and 4053 are heavily-doped with p-type or n-type dopants. Subsequently, a gate oxide layer 412 is formed on the semiconductor layer 405d. On the gate oxide layer 412 is formed with the gate metal 405b of the driving transistor 405 and the gate metal 406a of the switching transistor 406. The gate metals 405b and 406a are covered with an inner layer dielectric 414. Next the source/drain metals 405a, 405c of the driving transistor 405 and the source/drain metal 406b of the switching transistor 406 are formed on the inner layer dielectric 414. As shown, the source/drain metals 405a, 405c penetrate the inner layer dielectric 414 and the gate oxide layer 412 to contact with the doped areas 4051 and 4053, respectively. By way of the above-mentioned steps, the driving transistor 405 and the switching transistor 406 are constructed.

Before forming the organic light emitting diode 320, an insulating layer 416 is formed on the source/drain metals 405a, 405c and 406b, and then covered by a flat layer 418. In addition, the capacitor 408 can be formed below the transparent electrode 306.

During manufacturing the organic light emitting diode 320, the transparent electrode 306 is formed on the entire surface of the flat layer 418 to cover the driving transistor 405, the switching transistor 406 or the capacitor 408. Next, a cap pattern 402 is formed on the transparent electrode 306 via a photo mask. The position of the cap layer 402 is defined referring to the positions of the shadow layers such as gate metals 405b and 406a, source/drain metals 405a and 405c and capacitor 408 etc., which place below the transparent electrode 306. The uncovered position is served as an aperture 404 to expose the upper surface of the transparent electrode 306. Subsequently, the light emitting layer 310 and the reflective electrode 312 are formed on the entire surface of the cap pattern 402 and the aperture 404. Thus, only the light emitting layer 310 and the reflective electrode 312 which are in the aperture 404 can electrically connect to the transparent electrode 306 to generate light.

In other words, the organic light emitting diode 320 distributes in the region which is occupied by the apertures 404. The region is referred to as light-emitting region. The cap pattern 402 covers the non-light-emitting region of the organic electroluminescent display 400. The layout of the aperture 404 and the cap pattern 402 is shown as FIG. 4.

Figure 4:
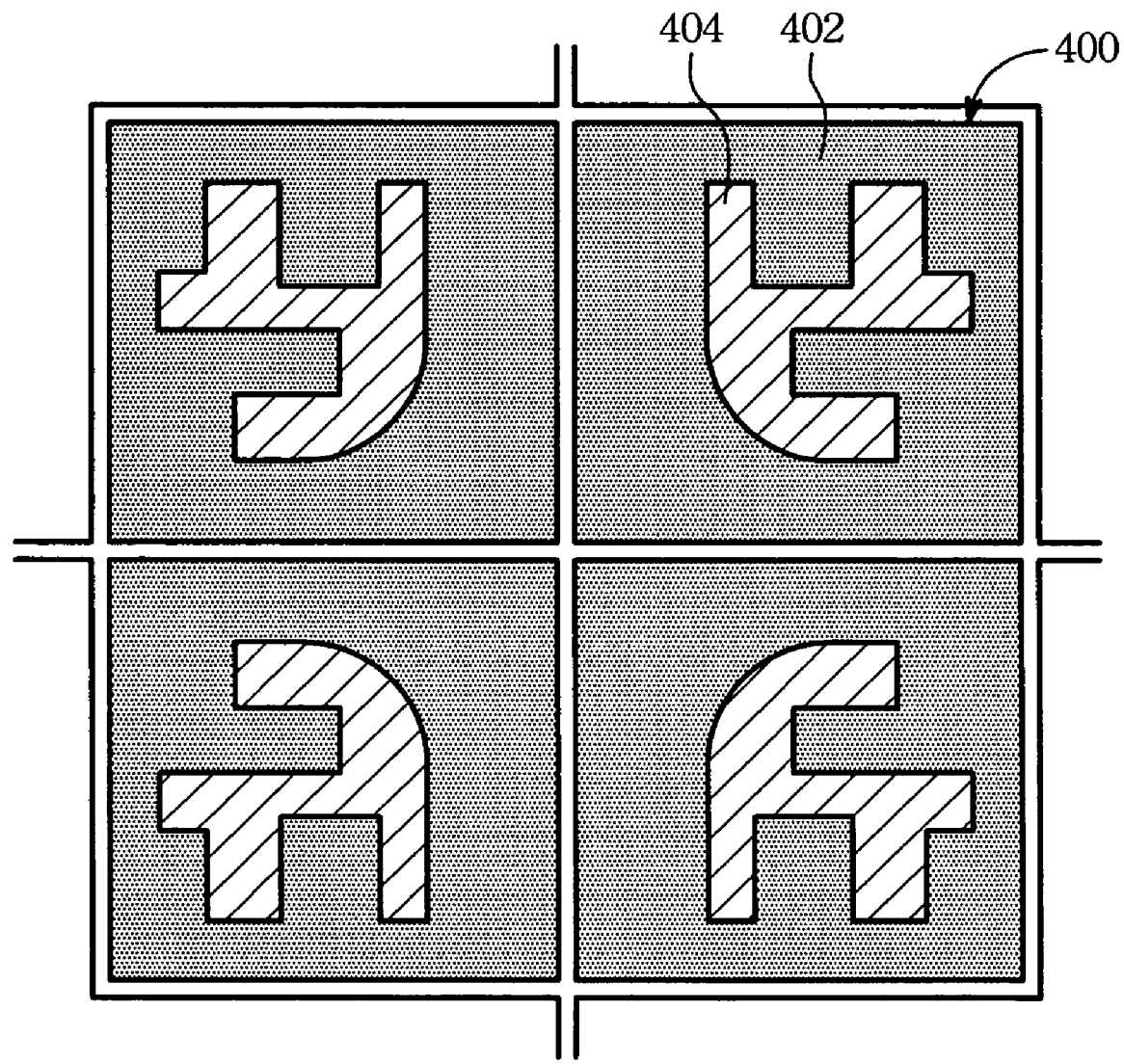
FIG. 4 is a top view of FIG. 3.

Refer to FIG. 4, the photo mask, which is used to form the cap pattern 402, has a pattern changed with the layout of wires, thin film transistors and capacitors below the transparent electrode 306. The aperture 404 has irregular shape to form the organic light emitting diode 320. In the region covered by the cap pattern 402, the transparent electrode 306 cannot electrically connect to the light emitting layer 310 and the reflective electrode 312 not to conduct the electric current, so the power can be save.

To sum up, the shadow layer of the present invention can be a metal layer, a metal wire, a gate, source or drain metals of a transistor, or a capacitor. The cap layer and the flat layer can be made from the photoresist or insulating material. The types of the transistor include p-channel or n-channel thin film transistors, top-gate or bottom-gate field effect transistors. The transparent electrode can be made from metal, transparent conductive materials such as ITO, IZO. The transparent substrate can be glass or plastic substrate.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A bottom-emission organic electroluminescent display having high pixel resolution wherein each pixel comprising:
   a substrate;
   a shadow layer disposed on the substrate;
   a transparent electrode disposed on the shadow layer, and having a larger area than the shadow layer;
   a cap layer disposed on the transparent electrode, wherein the cap layer has an aperture to expose a part of the transparent electrode, wherein the shadow layer is disposed in the aperture;
   a light emitting layer disposed on the part of the transparent electrode for emitting light downward, wherein a part of the cap layer is in the aperture and interposed between the transparent electrode and the light emitting layer, and the part of the cap layer is overlapped with the shadow layer;
   a reflective electrode disposed on the light emitting layer; and
   a first transistor electrically connected to the transparent electrode.

2. The bottom-emission organic electroluminescent display of claim 1, wherein the area of the substrate covered by the part of the cap layer in the aperture is equal to or smaller than that of the substrate covered by the shadow layer.

3. The bottom-emission organic electroluminescent display of claim 1, wherein the shadow layer comprises a metal layer.

4. The bottom-emission organic electroluminescent display of claim 1, wherein the shadow layer comprises a metal wire.

5. The bottom-emission organic electroluminescent display of claim 1, wherein the shadow layer comprises a gate metal of a second transistor.

6. The bottom-emission organic electroluminescent display of claim 1, wherein the shadow layer comprises a source metal of a second transistor.

7. The bottom-emission organic electroluminescent display of claim 1, wherein the shadow layer comprises a drain metal of a second transistor.

8. The bottom-emission organic electroluminescent display of claim 1, wherein the shadow layer comprises a capacitor.

9. The bottom-emission organic electroluminescent display of claim 1, wherein the transparent electrode covers the transistor and the shadow layer.

10. The bottom-emission organic electroluminescent display of claim 1, wherein the cap layer comprises an insulating pattern.

11. The bottom-emission organic electroluminescent display of claim 1, further comprising a flat layer disposed between the transparent electrode and the shadow layer.

* * * * *